United States Patent [19]

Jablway et al.

[11] Patent Number: 4,536,703
[45] Date of Patent: Aug. 20, 1985

[54] METHOD AND APPARATUS FOR TESTING CABLE WIRE CONNECTED TO TERMINALS AT A REMOTE LOCATION

[75] Inventors: Ali N. Jablway, Mt. Prospect, Ill.; Alexander M. Mitchell, Joppa, Md.

[73] Assignee: AT&T Technologies, Inc., New York, N.Y.

[21] Appl. No.: 382,749

[22] Filed: May 27, 1982

[51] Int. Cl.³ ............... G01R 19/00; G01R 31/02; G01R 15/12

[52] U.S. Cl. ............... 324/52; 324/66; 179/175.3 F

[58] Field of Search ............... 324/52, 66; 179/175.3 F

[56] References Cited

U.S. PATENT DOCUMENTS

| | | |
|---|---|---|
| 3,492,571 | 1/1970 | Desler . |
| 4,139,745 | 2/1979 | Ashdown . |
| 4,186,282 | 1/1980 | Ellson . |
| 4,186,283 | 1/1980 | Simmonds . |
| 4,257,002 | 3/1981 | Helms ............... 324/66 X |
| 4,399,400 | 8/1983 | Rockwell ............... 324/66 X |

Primary Examiner—Stanley T. Krawczewicz
Assistant Examiner—Jose M. Solis
Attorney, Agent, or Firm—R. P. Miller; M. de Picciotto

[57] ABSTRACT

The integrity and connection of cable wires (10–13) extending between two banks of terminals (20-1 to 20-4 and 16–19) are checked for shorts of the wires to ground, to battery wiring between each other and for opens and misconnections or cross-connections of the wires. Unique recognition circuits are provided for controlling, analyzing (circuits 43, 53, 68, 92, 112, 181) and displaying (displays 23, 24, 31 and 32) the test results to accordingly apprise an operator(s) stationed at either or both ends of the cable.

7 Claims, 5 Drawing Figures

METHOD AND APPARATUS FOR TESTING CABLE WIRE CONNECTED TO TERMINALS AT A REMOTE LOCATION

FIELD OF THE INVENTION

This invention relates to methods and apparatus for testing a group of wires interconnecting a first bank of terminals with a second bank of terminals for wire identification or for a number of wire faults, such as (1) shorts to ground, (2) shorts to battery wiring, (3) shorts between wires, (4) improper connection of wires to terminals, and (5) open wires.

BACKGROUND OF THE INVENTION

During the installation of and interconnection of various equipments in telephone central offices, it is necessary to make frequent wiring checks as to the integrity of connections made by means of exchange cable which is utilized to interconnect the various equipments. In many instances partially connectorized cable is utilized; that is, a cable having a number of wires that are connected at first ends to a plug-like connector and at the other or second ends are connected by wire wraps to terminals on a frame or in another piece of equipment. The pre-connectorization of the cable is usually accomplished in a cable manufacturing factory or at a distribution center before shipment to the telephone exchange. Prior to cutover of newly installed equipment connected to the central office equipment by connectorized cable, it is necessary that the cable be checked for proper connection of the plug terminals to the switch frame or distributing frame terminals.

A number of test facilities have been developed for making a number of checks of connectorized cable so as to ascertain shorts, continuity and proper wire interconnection. One such test facilities is shown in U.S. Pat. No. 3,492,571 to D. A. Desler assigned to the Western Electric Co., Inc., where a multi-conductor cable having plugs at opposite ends is checked for shorts, opens and wires that are misconnected or cross-connected between terminals at the respective plug ends of the cable. This test facility includes means for sequentially applying test pulses to terminals at one plug end and sensing the receipt of the signals at the second plug end. The received signals are then compared with signals generated by a reference program circuit. The signals from the plug end of the wire and the reference circuit are applied to a comparison circuit to determine correctness, and if the signals do not properly compare then error signals are generated. The error signals are utilized to operate visual displays that provide information as to the faulty wires and the type of error determined by the comparison circuit.

There is a need for a lightweight, portable test facility for checking cable wiring in a telephone exchange that can be transported, set up and run by a single operator. In use in a telephone central office such a test facility should be able to test for shorts between cable wires, open wires and misconnected or cross-connected wires, and this test facility should also have the capability of testing for shorts to a distributing or other switch frame to which the non-connectorized ends of the cable wires are connected. In addition, the test facility should have the ability to detect shorts between the switch frame terminal connected wires and the power source wiring for the equipment mounted on the frame.

Such a test facility should also possess the ability to rapidly perform the test without the utilization of relays, mechanical stepping switches or other bulky or slow operating components. Where the connectorized cable wires to be tested is terminated at first ends to a plug and at other ends to the terminals mounted on a chassis or frame, such as a telephone office distributing frame, the test facility should also include means for sequentially applying test pulses through a plug end of the cable to the frame mounted terminals without actually wiring the test set to the terminals on the frame. It would also be desirable if the test facility provided visual fault displays, both at the plug end of the cable as well as at the site where the cable wires are connected to the terminals on the switch frame. The test facility of the present invention obtains the desirable criteria set forth above.

SUMMARY OF THE INVENTION

This invention contemplates, among other things, methods and apparatus for conducting a number of tests on wires interconnecting separated terminal banks to determine (1) shorts to ground, (2) shorts to battery wiring, (3) shorts between the respective banks, (4) improper wire or cross wire connections and (5) open wire conditions.

More particularly, a first packaged test unit is connected to the first bank of terminals and the first bank of terminals are successively scanned to detect shorts of the wires to ground and to battery wiring. Subsequently thereto, the test operator sets the first test package to conduct a test to ascertain shorts between individual wires. During this test, ground signal conditions are successively applied to the first bank of terminals and between each application of a ground signal to a terminal, a test circuit is successively connected to the other terminals in the first bank to detect and visually display shorts between pairs of wires. Upon detection of any of the fault conditions, the test cycling is stopped so that the visual displays apprise the operator of the defects. The test unit includes additional capabilities of being able to be reinitiated into operation to conduct tests on the other wires following the detection of a fault in a particular wire.

A second test unit is provided which includes a probing device for contacting the terminals in the second bank for either applying or detecting signal conditions present in the second bank of terminals. The second package unit is interconnected with the first package test unit and the two units act in combination to perform tests to detect reversals in the connections of the wires between the respective terminal banks, and open wire conditions in the individual wires.

During this test, the attending operator moves the probe along the second bank of terminals until a fault is detected, whereupon a normally stepping display device associated with the second test unit is halted. As each wire is tested and if found to be properly connected, an auxiliary audible sound producing device is energized to produce an audible signal to apprise the operator that the associated terminal is properly wired at both ends. The attending operator then operates a switch on the probe to apply ground to the terminal determined to have a faulty wire connected thereto. The first test package cyclically scans the first bank of terminals for detection of a ground condition. Upon detection of the ground condition imparted from the probe, the second test unit is stopped. A second stepping visual display device associated with the second test unit is halted to indicate the wire on which the ground condition was detected. The two visual displays in the second test unit are thus operated to provide an indication as to the two wires that are improperly connected between corresponding terminals in the first and second banks of terminals.

In the situation where a faulty wire is detected and the fault is due to an open condition, the first display unit will be held to indicate the particular wire being tested while the other, or second display, is rapidly operated to provide a blinking indication to the operator that the wire being tested is open.

DESCRIPTION OF THE DRAWINGS

Other features and advantages of the invention will be apparent upon consideration of the following detailed description in conjunction with the drawings, wherein.

DETAILED DESCRIPTION

The test circuit forming the subject matter of the present application is designed to sequentially test twenty-five or more pairs of wires forming a cable that is installed at a telephone central office. First ends of the wires are connected to connectors at a factory or service center, and then the connectorized cable is transported to a telephone company central office where second ends of the cable are installed on terminals on a distributing or switch frame erected in the central office. For purpose of illustrating the operating principles of the test set, the present description will be confined to a consideration of the testing of a cable consisting of two pairs of wires. A total of five tests are conducted, three of the tests being conducted at the connectorized end of the cable, while the other two tests are conducted at the end of the cable connected to the terminals on the distributing or switch frame. More particularly, the test circuit is designed to test the pairs of cable wires for (1) shorts in individual cable wires to ground at the central office, (2) shorts in individual cable wires to the battery wiring at the central office, (3) shorts between individual cable wires, (4) opens in the individual cable wires and (5) reversals; that is, cable wires that are not connected to the proper terminals at the central office.

Figure 1:
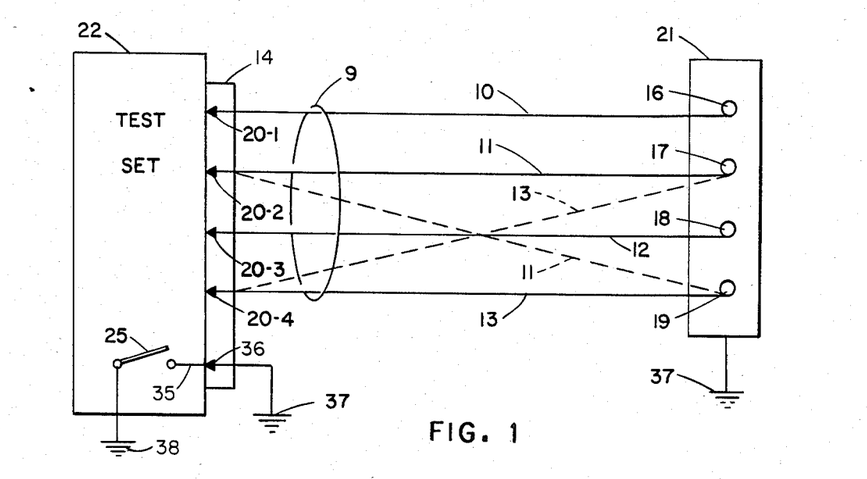
FIG. 1 is a schematic showing of a group of wires interconnecting first and second banks of terminals at separated locations on which a number of tests may be performed in accordance with the principles of the invention.
Figure 2:
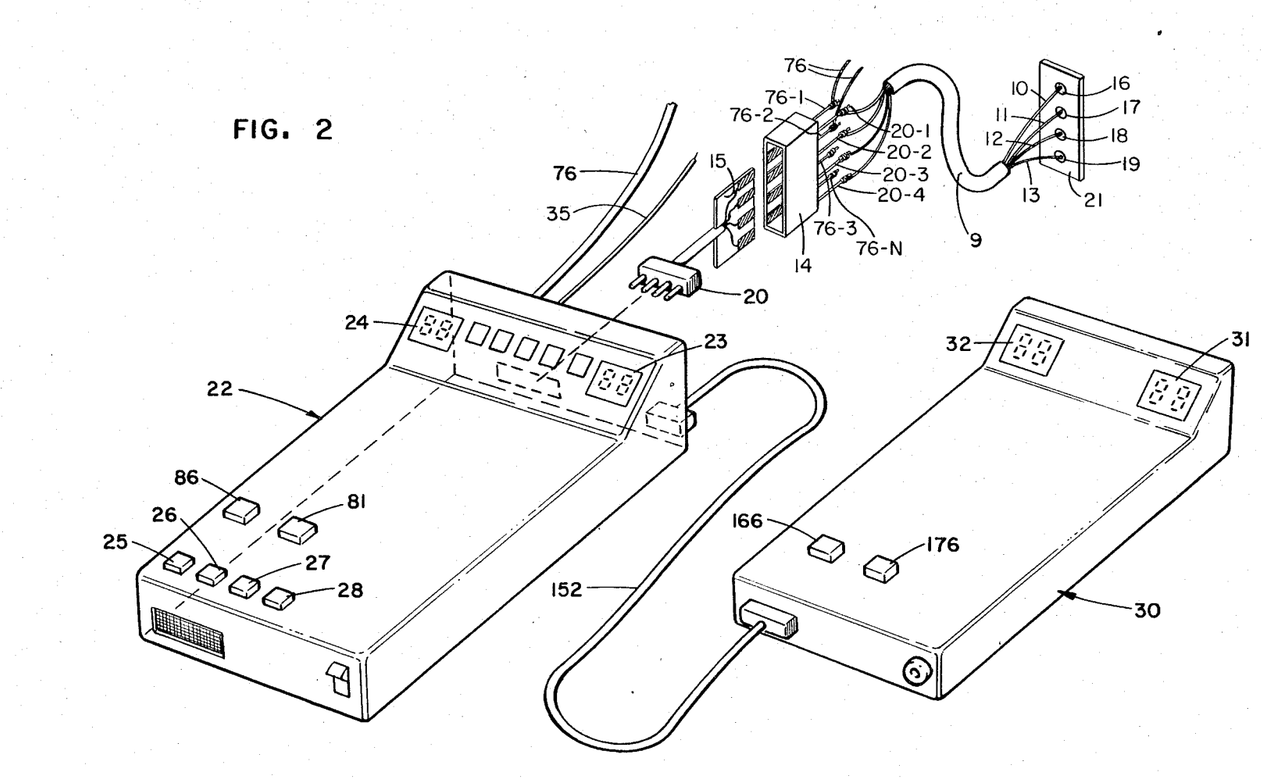
FIG. 2 is a perspective view of a pair of interconnected, packaged test units for performing certain of the tests at a first location and the remainder of the tests at another remote location.

Referring to FIG. 1 and 2, the four wires of a cable 9 to be tested are designated by the reference numerals 10, 11, 12 and 13 which are connected at first ends to first terminals of a factory assembled socket connector 14 adapted to receive a circuit pack insert 15 and connected (wire wrapped or soldered) at second ends to a second bank of terminals 16, 17, 18 and 19 mounted in a frame 21 located in a telephone central office. It is important to note that during the testing of the wires, the terminals 16-19 are not connected to operating circuits in the switching office. In other words, one may assume that the terminals are not electrically connected to other equipments. The first ends of the cable wire are, more specifically, connected to a first bank of terminals or contacts 20-1 to 20-4 of the factory assembled socket connector 14. The insert 15 is placed in the socket connector 14 to establish individual circuit connections to prongs of a plug connector 20 that is insertable in a suitable receptacle forming part of a first circuit test pack 22 of the test set.

Referring to FIG. 2 of the drawing, the circuit test pack 22 is shown to consist of two digital displays 23 and 24 for indicating particular wires being tested. The test pack also includes a series of circuit making pushbuttons 25, 26, 27 and 28 for conducting the individual tests. The test set also includes a second test pack 30 having displays 31 and 32 which are utilized to conduct the fourth and the fifth tests. When the fourth and fifth tests are conducted, the test operator will be remotely positioned from the test pack 22 at the switch frame 21 along with the test circuit pack 30.

Test for Short to Ground at the Central Office

Referring back to FIG. 1, it will be noted that an additional wire 35 is provided that runs from the test pack 22 to a terminal 36. This terminal 36 is connected to ground 37 of the central office. Closure of pushbutton 25 connects the ground 37 of the central office to a ground connection 38 of the test set pack 22 so that, in effect, the ground at central office is applied to the test pack.

Figure 3:
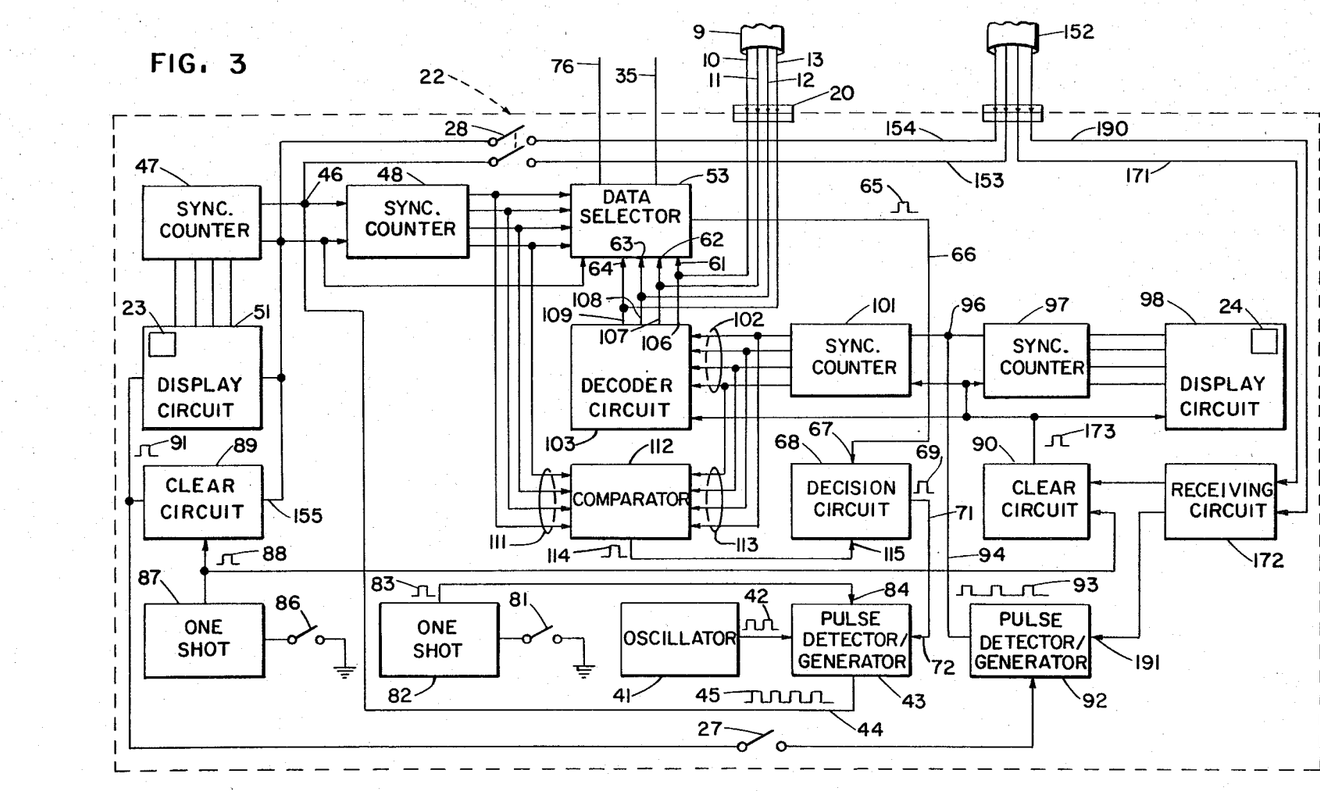
FIG. 3 is a schematic circuit and block diagram of the principal electrical components contained in a first of the packaged test units for conducting a number of tests on a first bank of terminals connected to the wires.

In addition, closure of pushbutton 25 initiates the short to ground test and unblocks the output of a continuously running oscillator circuit 41, see FIG. 3, to impress a train of pulses 42 on a pulse detector circuit 43 that responds by imparting pulses 45 onto a lead 44 running to a junction terminal 46, which in a first direction is connected to a first synchronous counter 47, and in the opposite direction to a second synchronous counter 48. The counter 47 converts the first pulse into a four unit binary coded signal indicative of the number 1. The binary signal is impressed on a display control circuit 51 which responds by operating the display 23 to indicate the number 1.

The first pulse signal impressed on the synchronous counter 48 is effective to generate a four unit binary coded signal indicative of the first wire 10 to be tested. This binary signal is applied to a data selector or ground detector test circuit 53 to effectuate the connection of the wire 10 to a port 61 for the detection of a short between the wire 10 and the ground. The data selector 53 may consist of a 16 line data selector/multiplexer 129B manufactured by the Western Electric Company, Inc., New York, or a TTL logic Circuit 74150 available from the Signetics Company, Sunnyvale, Calif. Data Selector 53 includes facilities for testing for a predetermined signal condition, such as the presence of a ground condition on any of the ports to which the test circuit is connected. If no short to ground is detected, the appearance of the second pulse of the pulse train 45 causes the data selector to connect the test set through the port 62 to the cable wire 11. The display 23 responds to display the number 2. Ports 63 and 64 are subsequently scanned to connect the wire 12 and 13 to the test circuit and then the cycle is repeated. In summary, the test circuit in the data selector circuit 53 is designed to sequentially look for ground on the ports 61-64.

If a ground is detected on port 61 indicative of a short to the ground of the central office, a defect signal 65 is impressed on an output lead 66 running to an input 67 of a decision circuit 68. Decision circuit 68 responds by impressing a defect or an inhibit signal 69 on a lead 71 running to an input 72 of the pulse detector circuit 43. This signal is effective to block the impression of a second pulse 45 on the lead 44. The testing is thus stopped and the display 23 is operated to indicate the number 1, thus, apprising the test operator that lead 10 is shorted to the ground of the central office.

Figure 4:
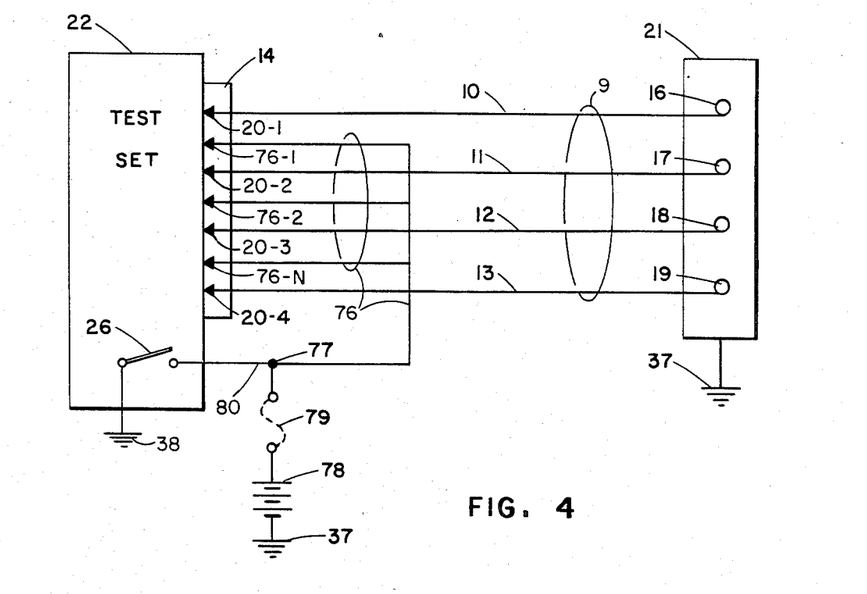
FIG. 4 is a schematic showing similar to FIG. 1 and particularly illustrating circuit connections utilized to conduct short to battery wiring tests on the wires.

Referring to FIG. 4 which is similar to FIG. 1 but in this instance a test is to be made to detect shorts between the cable wires 10-13 running to the terminals 20-1 and 20-4 of the connector 14 and power supply wiring depicted by the reference numeral 76 which is connected to connector terminals 76-1 to 76-N which are adjacent to connector terminals 20-1 to 20-4. In actual subsequent use of the equipment, central office power is supplied from a battery or generator 78, through a fuse 79 to a junction 77 which a common connection to the battery wiring. Preliminary to conducting this test, the fuse 79 is removed and a test set wire 80 is connected to the junction 77 which is effective to apply the test set ground 38 through the pushbutton circuit maker 26 (when closed), through common junction 77 to the battery wiring 76.

To conduct this test the pushbutton 26 is closed to apply ground to the battery wiring 76 and again the oscillator 41 is unblocked and the pulse train 45 is generated and applied both to the display circuit 51 and the data selector circuit 53. The ports 61-64 are sequentially scanned to detect the presence of test set ground through the battery wiring to any of the wires 10-13. If ground is detected, an output pulse 65 is again impressed over lead 66 to operate the decision circuit 68 to apply an inhibit signal 69 on the input 72 of the pulse detector 43. As a consequence, the scanning of the ports 61-64 is interrupted and the display 23 is operated to indicate which wire is shorted to the battery wiring.

If a particular wire is found to have either a short to ground or short to the battery wiring, the test set may be stepped to test the other wires while the testing operator makes a note of the defective wire. This is accomplished by the test operator closing an advance switch 81 (see also FIG. 2) which triggers a one-shot circuit 82 to impress a pulse 83 on an input 84 of the pulse detector circuit 43. The appearance of a pulse at input 84 causes an output pulse identical to the pulse 45 to appear on the lead 44. As a result, both the display circuit 51 and the data selector circuit 53 are stepped one increment to respectively display the next number and connect the next cable wire to the data selector 53.

At the start or the end of each test, a clear switch 86 is depressed to operate a one-shot circuit 87 to generate a clear signal 88 which is impressed through a clear circuit 89 and a clear circuit 90 that are connected to clear the ports on all of the discrete circuit packs so as to reset the circuit packs to an initial start condition; that is, to present a number 1 on display 23 and to impress a test scan on cable wire 10 when the overall test circuit is first initiated into operation by actuation of one of the pushbuttons 25-28.

Shorts Between Individual Cable Wires

For this test, the pushbutton 27 (see FIGS. 2 and 3) is depressed to connect additional test facilities into the test circuit. This test configuration will enable the detection of shorts, for example, between wires 11 and 12. The closure of the switch 27 again unblocks the output of the oscillator 41 and causes the impression of the pulse train 42 through the pulse detector 43 which, in turn, will cause the data selector circuit 53 to sequentially connect the test circuitry to the ports 61-64. In like manner, the display 23 is rapidly cycled to display the numbers 1-4 to indicate the wires being scanned. At the time that the port 64 is scanned, and the number 4 is displayed following the first scanning cycle, the display circuit 51 is effective to impress a control signal 91 on an input of the clear circuit 89 to reset and condition all circuit packs for the initiation of a test. Signal 91 is also impressed through now closed switch 27 to a pulse generator circuit 92 to generate a first pulsing signal 93 which is impressed on a lead 94 running to a junction point 96. Junction point 96 is connected in a first direction to a synchronous counter 97 which responds to the pulsing signal by generating a binary coded digital signal that is applied to a display control circuit 98 to cause the display 24 to depict a number 1. The pulsing signal 93 is also impressed on a synchronous counter 101 which generates a binary coded signal that is impressed over leads 102 to a decoder circuit 103.

As previously discussed, the data selector circuit 53 cyclically scans the ports 61-64 to sequentially sense for ground while the decoder circuit 103 is designated to sequentially apply test reference signals in the nature of ground to ports 106, 107, 108 and 109. At the time that the data selector 53 is looking for ground on port 61, the decoder circuit 103 is applying reference ground to port 106. Inasmuch as both these ports are connected to the wire 10, it would appear that the wire 10 is shorted to ground. This is, in reality a false indication because the wire 10 cannot be shorted to itself. To take care of this contingency, the binary signal impressed on the data selector circuit 53 is applied to inputs 111 of a comparator circuit 112. Simultaneous therewith the binary signal impressed on leads 102 is also impressed on a second series of inputs 113 of comparator circuit 112. When identical binary signals are impressed on inputs 111 and 113, the comparator circuit 112 generates an output blocking signal 114 which is impressed as an input 115 to decision circuit 68.

It will be recalled that whenever the data selector circuit 53 detects a ground condition on one of the wires 10-13, an output signal 65 is impressed on the lead 66 which, in effect, is passed through decision circuit 68 to the pulse detector 43 which functions to interrupt the subsequent application of the pulse train 45. However, when a pulse 114 appears on the decision circuit 68 at the same time that a short to ground presence signal 65 appears on the input 67, the decision circuit responds by not producing an output inhibit signal 69 to interrupt the testing cycle.

During the actual test sequence in which shorts between wire 10 and the other wires 11, 12 and 13 are determined, the port 106 will, in effect, be connected to the wire 10 while the data selector circuit 53 scans the other ports 62, 63 and 64 for detection of a ground condition. At the end of a cyclic scan of the ports 61-64 the display circuit 51 is again operated to impress an output pulse 91 which steps the pulse detector generator 92 to produce a second output pulsing signal 93 which causes the port 107 to receive a ground condition from the decoder circuit 103 so that the wire 11 is connected to detect shorts between this wire and the other wires 10, 12 and 13. During the time that both ports 62 and 107 are activated, the same binary signals are impressed on comparator circuit 112 to produce another output or special blocking signal 114 which is applied to decision circuit 68 to block the generation of an inhibit pulse 69.

If a short exists, for example, between wires 11 and 12, this condition can be detected when a test ground scan is applied to port 107 by the decoder circuit 103 and a test scan is applied to port 63 by the data selector circuit 53. It should be recalled that the normal test sequence is that a ground scan is applied to a port 106 and then the ports 61-64 are scanned or tested for grounds representative of shorts. Next, a test ground scan is applied to port 107 and the ports 61-64 are again scanned to detect grounds indicative of shorts. Assume that wires 11 and 12 are shorted and the test ground scan is applied to port 107, then the data selector 53 successively scans the ports 61-64. When the port 63 is scanned, a ground condition is detected running to the port 107 and as a result an inhibit signal is impressed over lead 66 to the input 67 of the decision circuit 68. Inasmuch as there is no input on input port 115, the decision circuit 68 impresses an inhibit signal 69 on the detector circuit 43. As a result no new pulse 45 will be impressed on lead 44 to step the display 23 in the display circuit 51. In other words, the display 23 will indicate a number 3. At this time, the second pulsing signal 93 impressed on point 96 caused the synchronous counter 97 to generate a binary coded signal that was impressed on the display circuit 98 to cause the display 24 to exhibit the number 2. Inasmuch as the pulse train 45 is interrupted there will be no further generation of pulses 91 by the display circuit 51 because this circuit is designed to only produce an output 91 when the display 23 is operated to go from number 4 to number 1. The attending operator will be thus apprised that there is a short between wires 11 and 12.

A significant feature of this portion of the circuit resides in the ability of the test circuit to ignore the ground condition detection when the scans are simultaneously impressed on ports 61 and 106 as well as scans being simultaneously impressed on the other complementary pairs of ports 62 and 107, 63 and 108 and 64 and 109. In these situations like binary signals are impressed on inputs 111 and 113 of comparator circuit 112 to generate a special blocking signal 114, that, when impressed on input 115 of decision circuit 68 along with the inhibit signal 65 impressed on leads 66 and input 67, causes the decision circuit 68 to block the production of an inhibit output signal 69.

Open and Reversal Tests

In order to conduct a test for opens in the individual wires or a misconnection (reversals) of the wires 10-13 extending from connector terminals 20-1 to 20-4 to the terminals 16-19 at the central office switch frame, the auxiliary test pack 30 is utilized in conjunction with the test unit 22. This pack 30 will be taken to the switch frame site in the central office and the test operator will sequentially probe each terminal 16 to 19 of the second bank with a tip 150 of a probing device 151 shown in FIG. 5. A control cable 152 is provided to interconnect the test pack 30 with the test pack 22. Cable 152 includes wires 153 and 154 that are connected respectively through normally open pushbutton switch 28 (see FIG. 3) to the junction 46 and an output 155 of the clear circuit 89. In effect, when switch 28 is closed, the wire 153 transmits the pulses 45 to a receiving circuit 156 in the auxiliary test pack 30. The receipt of each pulse 45 causes the receiving circuit 156 to impress a clock pulse 157 on a synchronous counter 158 which reacts to generate a binary coded signal that is applied to a display control circuit 159 having a numerical display 32 identical to numerical display 23. In fact, during the conduct of this test, both the displays 23 and 32 will be cyclically operated to provide identical numerical indications.

Figure 5:
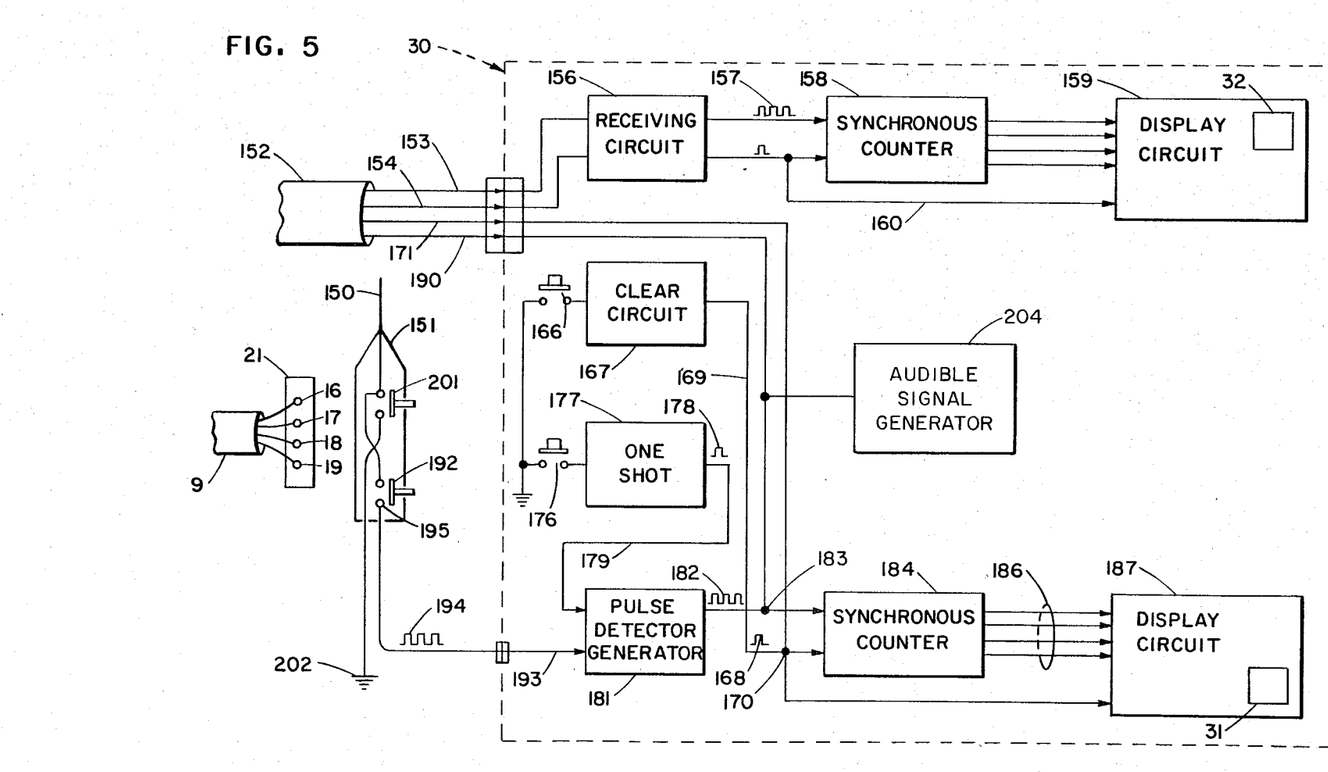
FIG. 5 is a schematic circuit and block diagram of the principal electrical components in a second of the test units that are utilized to conduct tests along a second bank of terminals connected to the wires.

It will be noted that each time the clear circuit 89 is operated upon completion of a complete cycle of operation of the display circuit 51, the clear pulse from output 155 is impressed over wire 154, through the receiving circuit 156 to clear synchronous counter 158. This clear signal also is imparted over a wire 160 to clear and reset display circuit to initial condition to again present the number 1 on the display 32 when the first pulse 45 is impressed on junction 46 to initiate a scan by the data selector circuit 53.

Prior to conducting this probing test, the test operator will operate the pushbutton switch 28 which is interconnected with switch 27 to interrupt the further application of pulses 91 to the first input of the pulse generator circuit 92. Closure of switch 28 (see FIG. 3) connects the wires 153 and 154 of cable 152 to the test pack 22. The test operator then moves to the test site at the switch frame to commence the test on the second bank of terminals 16-19. A clear pushbutton switch 166 (see FIGS. 2 and 5) is closed to operate a clear circuit 167 to apply a clear pulse signal 168 on a clear circuit wire 169 which clears certain of the resettable circuits in the test pack 30. This clear signal is also impressed through junction 170 and over a wire 171 forming part of cable 152. The clear signal is impressed through a receiving circuit 172 (see FIG. 3) in the test pack 22. The clear signal is placed on a second input to the clear pulse circuit 90 which, in turn, produces an output 173 to clear and reset circuits 97, 98, 101 and 103.

Next, the operator closes an advance pushbutton switch 176 to operate a one-shot circuit 177 which applies an output 178 on a lead 179 which, in turn, is impressed through a pulse detector 181 and appears as a pulse 182 on a junction point 183. This pulse 182 operates a synchronous counter 184 to generate a binary coded digital signal that is impressed through leads 186 to operate a display control circuit 187 which responds by impressing the number 1 on a display 31. The appearance of the number 1 on display 31 informs the test operator that the test procedure may commence on the first terminal; namely, terminal 16.

The appearance of the pulse 182 at junction point 183 is also impressed over a wire 190 to cause the receiving circuit 172 to impress a pulse on the second input 191 to the pulse detector circuit 92. Circuit 92 responds by impressing a first pulse 93 on the lead 94 to operate the synchronous counter 101 to generate a binary signal that is applied through leads 102 to decoder circuit 103. Decoder circuit 103 accordingly applies a reference ground condition to port 106. At this time the display 24 of display circuit 98 will indicate the number 1.

The test operator now closes a probing switch 192 and places the probe on the terminal number 16 associated with wire number 10. If wire number 10 of the cable 9 is not open, the reference ground condition impressed on port 106 is applied over wire 10 and passes through the switch 192 and probe output 195 to a lead 193. This ground condition is represented by a pulse 194 that is impressed on a second input to the pulse detector 181 thereby causing the generation of a single output pulse 182 which is impressed on the synchronous counter 184 to generate a binary coded signal indicative of the number 2. This binary signal actuates the display unit 187 to advance the display 31 to depict the number 2. The appearance of number 2 on display 31 indicates to the operator that the first wire 10 is not open and that he may proceed to probe the second wire 11. The pulse 182 is also applied over the lead 190 and through the receiving circuit 172 (see FIG. 3) to operate the pulse detector 92 to produce an output signal 93 which is effective to move the applied reference ground from port 106 to port 107. If the operator probes wire number 11 and this wire is not open, then another ground condition pulse 194 and a signal output pulse 182 are generated to cause the display unit 187 to operate the display 31 to indicate the number 3.

If wire 11 is open or connected to any terminal other than the terminal 17, an open wire condition will be detected. More particularly, when the probe tip 150 is placed on terminal 17 and the reference ground condition applied to port 107 is not detected, then the pulse detector 181 is not operated and the display 31 is not advanced; thus holding the display of the number 2 and hence, apprising the operator that there is a problem with respect to wire number 11.

In order to detect whether the fault in wire 11 is an open or an improper terminal connection, the operator releases the probing switch 192 and depresses a reversal identification switch 201 of the probe device 151. Inasmuch as no additional pulses 194 are available, there are no signals produced to operate the pulse detector 92 and, hence, the decoder circuit 103 is not stepped and continues to apply ground to port 107.

Assume that terminal 17 is improperly connected to the wire 13 (see FIG. 1) and terminal 19 is improperly connected to wire 11, that is to say that the wires 11 and 13 are reverse connected to terminals 17 and 19. It should be recalled that during all the time that all of the tests are being conducted with the use of the test pack 30, the ports 61-64 are being continuously scanned to sequentially connect the test circuit 53. The operator holds the probe on terminal 17 and when the port 64 is scanned to connect the test circuit of the data selector 53 to port 64, a ground condition on wire number 13 is detected because the probe tip 150 on terminal 17 is now applying ground 202 to wire 13. Accordingly, an output signal 65 is produced by data selector 53 and impressed over the lead 66 to operate the decision circuit 68 to impress an inhibit pulse 69 on the pulse detector 43, whereupon the pulse train 45 is interrupted. This interruption occurs when the display circuits 51 and 159 present the number 4 on the displays 23 and 32. The appearance of the held number 2 on the display 32 and the number 4 on the display 31 will apprise the operator that there has been a reversal in the connection of wires 11 and 13 to the terminals 17 and 19. This may be verified by placing the probe on terminal 19, whereupon the displays 32 and 31 will respectively present the numbers 2 and 4.

If, however, the problem is that the wire 11 is open, then the probing of the terminals 16-19 will be stopped by the test operator on terminal 17 because the display 31 is not advanced as would be normally expected for a good wire. At this time the display 31 will indicate the number 2. While the probe is held on the terminal 17, the scanning of ports 61-64 continues, and inasmuch as no ground conditions from source 202 are detected by the data selector 53, no ground detection signals 65 are generated and, as a result, the pulse stream 45 continues to cause the cyclic scanning of the ports 61-64. The display 32 will cyclically operate to present the numbers 1 to 4 on a repetitive cycle. This continued repetive operation of display 32 and the continued presentation of the number 2 on display 31 indicates to the operator that wire 11 is open.

All the components used in the construction of the test facility are of a miniature size, hence, the circuit may be packaged in small cases and easily transported by a single operator to different installation or service areas. Such a compact portable test facility may also be utilized as a cable wire identifier during initial connection of the wires to the switch or distributor frame. In this instance, the connectorized end 14 of the cable is plugged into the test package 22 and the probe at the wire installation site is used to sequentially contact the free ends of the wires.

With the probe tip 150 engaging any of the wires 10-13, the identification switch 201 is closed to apply ground over the contacted wire to a particular terminal 20-1 to 20-4 of the socket connector 14. The data selector cyclically scans the ports 61-64 until ground is detected, whereupon inhibit signals 65 and 69 are generated to effectuate the blocking of the output of the pulse detector 43. Inasmuch as the pulses 45 from the pulse detector cyclically step the display control circuit 159 in concurrence with the scanning action of the data selector 53, the stopping of the display circuit 159 will occur at the time that the data selector circuit 53 senses the ground on the wire. The display circuit 159 stops the changing display 32 with a numerical indication of a port 61-64 and, hence, a terminal 20-1 to 20-4 on which the ground is sensed thus apprising the operator of the identity of the plug terminal connection of the wire engaged by the probe tip 150. The operator thereupon makes the appropriate connection of the wire end to one of the terminals 16-19 on the frame 21.

The operator use of the test facility may be enhanced by providing an audible signal when the probe 151 tests a wire that is properly connected at both ends. This is accomplished by connecting an audible signal generator 204 to the lead 190 which receives a pulse each time a determination is made that a wire is properly connected between appropriate terminals 16 to 19 and 20-1 to 20-4.

Through the afore-described applications of the invention relate to a cable that is connectorized at one end, it is to be understood that the invention has applicable uses in the testing of cables that are connectorized at both ends as well as cables that are not connectorized at either end. For example, the described test facility may be used to test the integrity of any cable at a cable manufacturing installation or the test facility may be used to test cable extending between any two electrical devices.

What is claimed is:

1. A test system for ascertaining shorts between wires forming a cable, which comprises:
    selector means for sequentially applying a ground condition on first ends of the wires;

means rendered effective upon application of a ground condition on a wire for sequentially testing said first ends of the wires for the presence of a ground condition and generating a ground presence signal;

means responsive to said ground presence signal for generating an inhibit signal upon said testing means ascertaining a ground condition at one of the first ends of the wires;

means responsive to said inhibit signal for interrupting further operation of said sequential testing means;

means operative upon said test means ascertaining the application of a ground signal to the same wire that the selector means applies a ground condition for generating a blocking signal; and decision means rendered effective by said blocking signal for precluding generation of an inhibit signal by said inhibit signal generation means.

2. A method of detecting shorts between a group of wires, which comprises:

sequentially connecting on continuing cycles a test circuit to first ends of the wires to detect the presence of a test signal impressed on another wire shorted to the wire under test;

sequentially applying a test signal to each of the first ends of the wires, said application of each of said test signals being a sufficient duration to permit a cyclic connection of the test circuit to sequentially test all of the first ends of the wires;

generating an inhibit signal in response to a test signal detected by the test circuit;

interrupting the cyclic testing upon generation of an inhibit signal;

generating a first control signal indicative of each wire being tested;

generating a second control signal indicative of each wire being subjected to a test signal; and blocking the inhibit signal in response to control signals being generated indicative of the same wire being subjected to a test signal and being connected to the test circuit to permit the testing of the other wires with respect to said same wire.

3. A method as set forth in claim 2, which comprises:

visually indicating each wire connected to the test circuit; and visually indicating each wire being subjected to a test signal, whereupon the generation of an inhibit signal to interrupt the cyclic operation of testing provides a visual indication of the wires shorted to each other.

4. A method as set forth in claim 2, which comprises:

generating a stepping signal upon completion of each cyclic testing of the first ends of the wires;

utilizing said stepping signal to advance the applied test signal to a next succeeding first end of another wire.

5. A test system for detecting shorts between a group of insulated wires, which comprises:

means for sequentially applying a test voltage condition to first ends of the wires;

a test circuit for ascertaining the appearance of said test voltage condition on the first ends of the wires;

means rendered effective following each sequential application of a test voltage condition on a first end of a wire for sequentially connecting said test circuit to all of the first ends of the wires;

a first visual means for indicating the wire having the test voltage condition applied thereto;

a second visual means for indicating the wire on which the test circuit is connected;

means rendered effective upon the test circuit means ascertaining a test voltage condition for generating an inhibit signal;

means responsive to said inhibit signal for interrupting the sequential connection of the test circuit to the first ends of the wires; and means rendered effective by the simultaneous application of test voltage condition and the connection of the test circuit to the same end of the same wire for blocking operation of said interrupting means, whereupon the test system continues to test the other wires.

6. A system for detecting shorts between a group of wires interconnected between a first set of terminals and a second set of terminals, which comprises:

an oscillator for generating a train of pulses;

means responsive to said train of pulses for generating a first set of binary digital signals indicative of wires that a test signal is to be sequentially applied:

means for generating a second set of binary digital signals indicative of the wires that are to be sensed to determine the presence of said test signal to provide a signal representating a short between two wires;

means responsive to each binary signal of said first set for sequentially applying said test signal to successive first terminals;

means rendered effective upon application of a test signal to a first wire and said second set of binary signals for sequentially sensing the presence of said test signal on all of said wires;

means responsive to the sensing means sensing said test signal indicative of a short for generating an inhibit signal;

means responsive to the generation of said inhibit signal for interrupting said train of pulses;

means for comparing said first and second binary signals; and means responsive to said comparing means ascertaining a correspondence of a binary signal indicative of wire being sensed and a wire to which the test signal is being applied for applying a blocking signal to block said inhibit signal from interrupting said train of pulses.

7. A system for detecting shorts between wires of a group of cable wires, which comprises:

an oscillator for generating a train of pulses;

selector means including test means for sequentially connecting successive first ends of said group of cable wires to said test means, said test means generating a defect signal upon sensing a ground condition on a wire connected to said test means;

a pulse detector-generator means operated by each pulse of said train for generating a control pulse;

a first synchronous counter for converting said control pulses into a succession of first binary coded signals indicative of successive wires to be connected to said test means and for applying said binary coded signals to said selector means to successively connect the first ends of the wires to said test means;

a first display means operative in response to each control pulse for generating a repetitive series of numerical displays indicative of each successive wire connected to said test means;

means for sequentially applying a ground condition to the first ends of the wires;

means responsive to said display means being operated to go from an indication the last wire of said group of wires to the first wire of said group for generating a pulsing signal;

a second synchronous counter for converting said pulsing signals into a second binary coded signal and applying said binary coded signal to successively operate said ground applying means to successively apply the ground condition to successive first ends of the wires;

a second display means operative in response to said pulsing signals for generating a series of numerical displays indicative of a ground condition being applied to each successive wire;

a decision circuit means responsive a defect signal for generating an inhibit signal and for applying said inhibit signal to interrupt generation of said control pulses and operation of said display means; whereupon said first and second displays means present numbers indicative of a pair of shorted wires; and comparator means operative in response to a pair identical first and second binary coded signals for generating a blocking signal and applying said blocking signal to said decision circuit to preclude the generation of an inhibit signal.

* * * * *